(12) United States Patent
Harnik et al.

(10) Patent No.: US 10,592,170 B2
(45) Date of Patent: Mar. 17, 2020

(54) OPTIMIZING DUAL-LAYERED COMPRESSION IN STORAGE SYSTEMS

(71) Applicant: INTERNATIONAL BUSINESS MACHINES CORPORATION, Armonk, NY (US)

(72) Inventors: Danny Harnik, Tel Mond (IL); Sergey Marenkov, Tel Aviv (IL); Yosef Shatsky, Karnei Shomron (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/414,793

(22) Filed: Jan. 25, 2017

(65) Prior Publication Data

US 2018/0210658 A1 Jul. 26, 2018

(51) Int. Cl.
G06F 3/06 (2006.01)
H03M 7/30 (2006.01)
G06F 16/174 (2019.01)

(52) U.S. Cl.
CPC ............. *G06F 3/067* (2013.01); *G06F 3/061* (2013.01); *G06F 3/0659* (2013.01); *G06F 16/1744* (2019.01); *H03M 7/3059* (2013.01); *H03M 7/6023* (2013.01); *G06F 2212/401* (2013.01)

(58) Field of Classification Search
CPC ............. G06F 12/00–16; G06F 3/0608; G06F 3/0611–0613; G06F 3/0641; G06F 7/74; G06F 8/4434–4436; G06F 9/30156; G06F 11/1453; G06F 16/174–1756; G06F 17/2252; G06F 2211/007–008; G06F 2211/1014; G06F 2212/40–403; G06F 3/0638; G06F 17/30153; G06F 2212/401; H03M 7/3059–3064; H03M 7/55–6094; H03M 13/6312; H03M 13/6558
See application file for complete search history.

(56) References Cited

U.S. PATENT DOCUMENTS

| | | | | |
|---|---|---|---|---|
| 5,596,564 | A | * | 1/1997 | Fukushima ........ G11B 20/1254 360/39 |
| 5,729,228 | A | * | 3/1998 | Franaszek ............... G06T 9/005 341/106 |
| 8,954,693 | B2 | | 2/2015 | Seo et al. |
| 9,148,172 | B2 | | 9/2015 | Manning et al. |
| 9,176,887 | B2 | | 11/2015 | Habermann |

(Continued)

OTHER PUBLICATIONS

Hyun et al., "Memory-Efficient Compressed Filesystem Architecture for NAND Flash-Based Embedded Systems," International Conference on Computational Science and Its Applications, 2007 (13 pages).

(Continued)

*Primary Examiner* — Nicholas J Simonetti
(74) *Attorney, Agent, or Firm* — Griffiths & Seaton PLLC

(57) ABSTRACT

Embodiments for optimizing dual-layered data compression in a storage environment. In a data storage system having a primary compressor and a secondary compressor, the primary compressor is selectively used to perform a first one of a plurality of actions on Input/Output (I/O) data while a second one of the plurality of actions is performed on the I/O data by the secondary compressor, thereby reducing latency and improving an overall compression performance while processing the I/O data.

21 Claims, 7 Drawing Sheets

(56) References Cited

U.S. PATENT DOCUMENTS

| | | | | |
|---|---|---|---|---|
| 2008/0049276 A1* | 2/2008 | Abe | ............... | G06F 3/0608 |
| | | | | 358/524 |
| 2012/0284239 A1* | 11/2012 | Agarwala | ........... | G06F 3/0608 |
| | | | | 707/693 |
| 2013/0290615 A1* | 10/2013 | Shah | ............... | G06F 3/0608 |
| | | | | 711/103 |
| 2014/0195498 A1 | 7/2014 | Asher et al. | | |
| 2015/0093023 A1* | 4/2015 | Greenebaum | ........... | G06T 9/00 |
| | | | | 382/166 |
| 2016/0246811 A1* | 8/2016 | Ackerman | ....... | G06F 17/30153 |

OTHER PUBLICATIONS

Lee et al., "Improving Performance and Lifetime of Solid-State Drives Using Hardware-Accelerated Compression," IEEE Transactions on Consumer Electronics, vol. 57, No. 4, Nov. 2011 (8 pages).
Yim et al., "A Flash Compression Layer for SmartMedia Card Systems," IEEE Transactions on Consumer Electronics, vol. 50, No. 1, Feb. 2004 (6 pages).

* cited by examiner

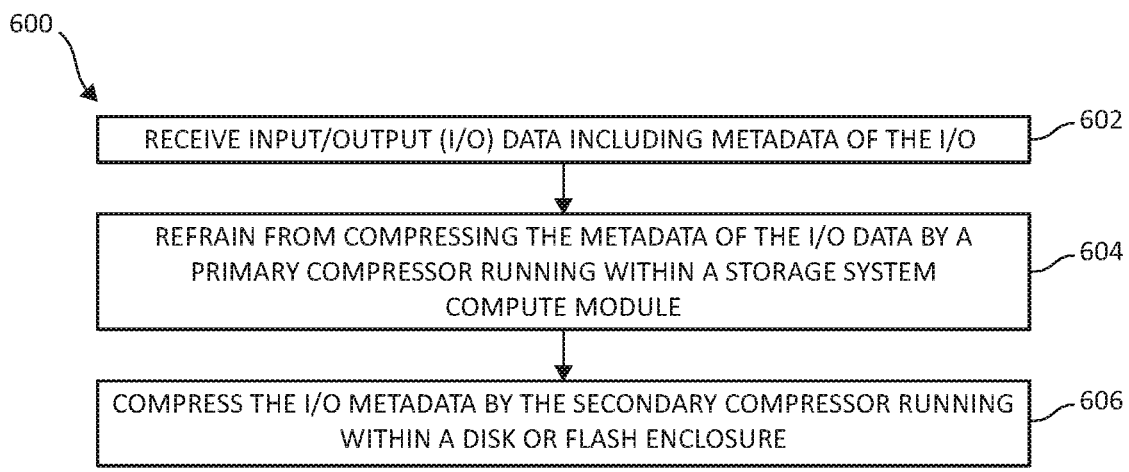

US 10,592,170 B2

OPTIMIZING DUAL-LAYERED COMPRESSION IN STORAGE SYSTEMS

BACKGROUND OF THE INVENTION

Field of the Invention

The present invention relates in general to computing systems, and more particularly to, various embodiments for data compression management within and/or between distributed computing components.

Description of the Related Art

In today's society, computer systems are commonplace. Computer systems may be found in the workplace, at home, or at school. As computer systems become increasingly relied upon, convenient, and portable, the Internet has grown exponentially. Now, more than ever before, individuals and businesses rely upon distributed storage systems (commonly referred to as "the cloud") to store information and data. As wide strides in technological advancement relating to data access devices have been accomplished, there is an ever-growing demand for growth and development within the back end supporting systems that provide and store the data content.

SUMMARY OF THE INVENTION

Various embodiments for optimizing dual-layered data compression in a storage environment are provided herein. In one embodiment, by way of example only, a method comprises, in a data storage system having a primary compressor and a secondary compressor, selectively using the primary compressor to perform a first one of a plurality of actions on Input/Output (I/O) data while performing a second one of the plurality of actions on the I/O data by the secondary compressor, thereby reducing latency and improving an overall compression performance while processing the I/O data.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 5 illustrates a flowchart diagram illustrating an exemplary method for optimizing dual-layered data compression in a storage environment by a processor, by which aspects of the present invention may be implemented;

FIG. 6 illustrates an additional flowchart diagram illustrating an exemplary method for optimizing dual-layered data compression in a storage environment by a processor, by which aspects of the present invention may be implemented;

DETAILED DESCRIPTION OF THE DRAWINGS

Figure 1:
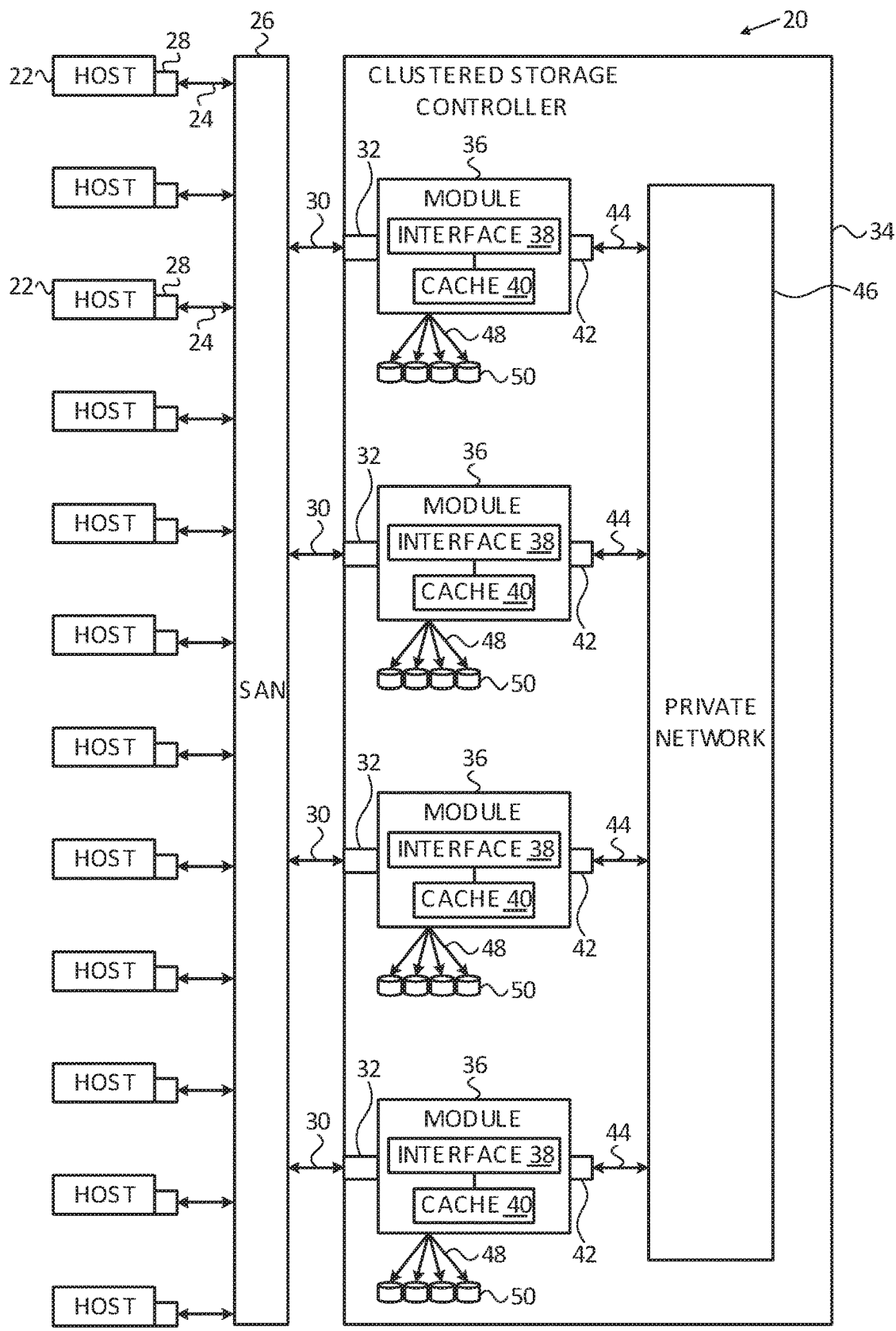
FIG. 1 illustrates a block diagram of a computer storage environment in which aspects of the present invention may be realized.

Data compression is widely used to reduce the amount of data required to process, transmit, or store a given quantity of information. Data compression is the coding of data to minimize its representation. Compression can be used, for example, to reduce the storage requirements for files, or to increase the communication rate over a channel. However, data compression generally consumes a significant amount of computing (e.g. central processing unit "CPU") resources.

This data reduction has become a key feature for modern storage systems. Specific storage space savings provided from compression methods vary from implementation to implementation, however can be substantial (e.g., up to an 80% savings, meaning capacity is increased fivefold). Compression can be implemented either inline or as a post process. When inline compression is enabled (i.e., on a volume) during subsequent data writes, the compressible data is compressed and written to the storage. When post process compression is enabled, the new data writes to the storage which were not compressed initially (if inline compression is enabled), and are rewritten as compressed data to the storage when the post process compression is run.

The primary storage market is composed of two types of drives, disk drives and flash drives. Some of the methods disclosed herein are particularly well-suited for flash drives, which have an Input/Output (I/O) granularity of typically 4 Kilobytes (KB). Nonetheless, one of ordinary skill in the art would recognize that the functionality disclosed following is relevant to other storage devices (e.g., disk drives) as well. The functionality taught herein considers several mechanisms to efficiently utilize the existence of two different compression layers in a storage system. These mechanisms can be advantageous if, for example, a disk drive (e.g., flash drive) enclosure used in a storage system includes built-in compression capabilities. This drive-level compressor cannot practically replace the primary compressor of the storage system (i.e., in a storage controller) because the primary compressor has several advantages over the secondary compressor. The secondary drive-level compressor may, however, provide benefits when used in conjunction with the primary storage controller-level compressor, as will be discussed.

The concept of two compressors is somewhat counterintuitive since compressing the same data twice will not ultimately reduce the size of the data any further. Assume two compressors, a primary compressor running as part of the storage system's compute module, and a secondary compressor built into a disk drive or flash enclosure.

The primary compressor is able to achieve a high compression ratio and reduce data size early in the write path, lowering the load on the storage system. The secondary compressor is built into the storage drive (e.g., flash drive) and runs at line speed thereby having low latency, however produces a weaker compression ratio of the data compressed therein. The present invention considers each of the best properties of the primary and secondary compressor, which when used concurrently, improve latency and an overall compression performance of the storage system.

Turning now to FIG. 1, a schematic pictorial illustration of a data processing storage subsystem 20 is shown, in accordance with a disclosed embodiment of the invention. The particular subsystem shown in FIG. 1 is presented to facilitate an explanation of the invention. However, as the skilled artisan will appreciate, the invention can be practiced using other computing environments, such as other storage subsystems with diverse architectures and capabilities.

Storage subsystem 20 receives, from one or more host computers 22, Input/Output (I/O) requests, which are commands to read or write data at logical addresses on logical volumes. Any number of host computers 22 are coupled to storage subsystem 20 by any means known in the art, for example, using a network. Herein, by way of example, host computers 22 and storage subsystem 20 are assumed to be coupled by a Storage Area Network (SAN) 26 incorporating data connections 24 and Host Bus Adapters (HBAs) 28. The logical addresses specify a range of data blocks within a logical volume, each block herein being assumed by way of example to contain 512 bytes. For example, a 10 KB data record used in a data processing application on a given host computer 22 would require 20 blocks, which the given host computer might specify as being stored at a logical address comprising blocks 1,000 through 1,019 of a logical volume. Storage subsystem 20 may operate in, or as, a SAN system.

Storage subsystem 20 comprises a clustered storage controller 34 coupled between SAN 26 and a private network 46 using data connections 30 and 44, respectively, and incorporating adapters 32 and 42, again respectively. In some configurations, adapters 32 and 42 may comprise host SAN adapters (HSAs). Clustered storage controller 34 implements clusters of storage modules 36, each of which includes an interface 38 (in communication between adapters 32 and 42), and a cache 40. Each storage module 36 is responsible for a number of storage devices 50 by way of a data connection 48 as shown.

As described previously, each storage module 36 further comprises a given cache 40. However, it will be appreciated that the number of caches 40 used in storage subsystem 20 and in conjunction with clustered storage controller 34 may be any convenient number. While all caches 40 in storage subsystem 20 may operate in substantially the same manner and comprise substantially similar elements, this is not a requirement. Each of the caches 40 may be approximately equal in size and is assumed to be coupled, by way of example, in a one-to-one correspondence with a set of physical storage devices 50, which may comprise disks. In one embodiment, physical storage devices may comprise such disks. Those skilled in the art will be able to adapt the description herein to caches of different sizes.

Each set of storage devices 50 comprises multiple slow and/or fast access time mass storage devices, hereinbelow assumed to be multiple hard disks. FIG. 1 shows caches 40 coupled to respective sets of storage devices 50. In some configurations, the sets of storage devices 50 comprise one or more hard disks, which can have different performance characteristics. In response to an I/O command, a given cache 40, by way of example, may read or write data at addressable physical locations of a given storage device 50. In the embodiment shown in FIG. 1, caches 40 are able to exercise certain control functions over storage devices 50. These control functions may alternatively be realized by hardware devices such as disk controllers (not shown), which are linked to caches 40.

Each storage module 36 is operative to monitor its state, including the states of associated caches 40, and to transmit configuration information to other components of storage subsystem 20 for example, configuration changes that result in blocking intervals, or limit the rate at which I/O requests for the sets of physical storage are accepted.

Routing of commands and data from HBAs 28 to clustered storage controller 34 and to each cache 40 may be performed over a network and/or a switch. Herein, by way of example, HBAs 28 may be coupled to storage modules 36 by at least one switch (not shown) of SAN 26, which can be of any known type having a digital cross-connect function. Additionally, or alternatively, HBAs 28 may be coupled to storage modules 36.

In some embodiments, data having contiguous logical addresses can be distributed among modules 36, and within the storage devices in each of the modules. Alternatively, the data can be distributed using other algorithms, e.g., byte or block interleaving. In general, this increases bandwidth, for instance, by allowing a volume in a SAN or a file in network attached storage to be read from or written to more than one given storage device 50 at a time. However, this technique requires coordination among the various storage devices, and in practice may require complex provisions for any failure of the storage devices, and a strategy for dealing with error checking information, e.g., a technique for storing parity information relating to distributed data. Indeed, when logical unit partitions are distributed in sufficiently small granularity, data associated with a single logical unit may span all of the storage devices 50.

While not explicitly shown for purposes of illustrative simplicity, the skilled artisan will appreciate that in some embodiments, clustered storage controller 34 may be adapted for implementation in conjunction with certain hardware, such as a rack mount system, a midplane, and/or a backplane. Indeed, private network 46 in one embodiment may be implemented using a backplane. Additional hardware such as the aforementioned switches, processors, controllers, memory devices, and the like may also be incorporated into clustered storage controller 34 and elsewhere within storage subsystem 20, again as the skilled artisan will appreciate. Further, a variety of software components, operating systems, firmware, and the like may be integrated into one storage subsystem 20.

Figure 2:
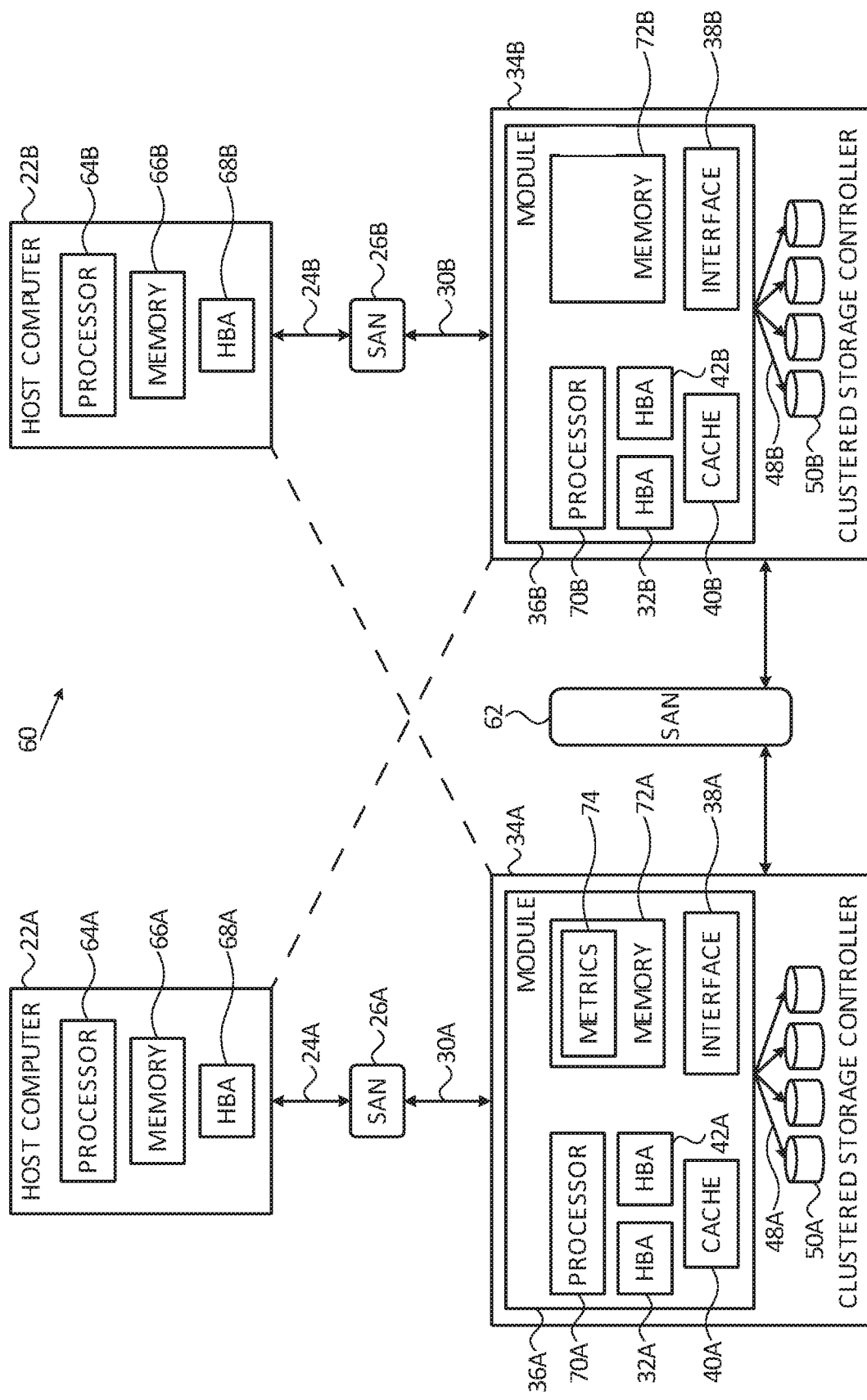
FIG. 2 illustrates a block diagram of a hardware structure of a data storage system in which aspects of the present invention may be realized.

FIG. 2 is a schematic pictorial illustration of facility 60 configured to perform host computer monitoring, in accordance with an embodiment of the present invention. In the description herein, host computers 22, storage controllers 34 and their respective components may be differentiated by appending a letter to the identifying numeral, so that facility 60 comprises a first host computer 22A (also referred to herein as a primary host computer) coupled to a clustered storage controller 34A via a SAN 26A, and a second host computer 22B (also referred to herein as a secondary host computer) coupled to a clustered storage controller 34B via a SAN 26B. In the configuration shown in FIG. 2 storage controllers 34A and 34B are coupled via a facility SAN 62. In other embodiments, as will be described herein, the first host computer 22A may be directly connected to the clustered storage controller 34B, and the second host computer 22B may be directly connected to the clustered storage controller 34A via a SAN similar to SAN 62, a virtualized networking connection, or any other computer implemented medium. The coupling of the clustered storage controller 34A and clustered storage controller 34B via SAN 62 enables the establishment of a variety of storage techniques including disaster recovery (DR) techniques. As will be further described herein, such coupling provides the back-end infrastructure needed for the establishment of data mirroring operations between the clustered storage controllers 34A/34B (and likewise between first host computer 22A and second host computer 22B interconnected between clustered storage controllers 34A/34B), or otherwise a host of related DR operations as commonly known in the art.

Host computer 22A comprises a processor 64A, a memory 66A, and an adapter 68A. Adapter 68A is coupled to SAN 26A via a data connection 24A.

As described supra, module 36A is coupled to storage devices 50A via data connections 48A, and comprises adapters 32A and 42A, a cache 40A, and an interface 38A. Module 36A also comprises a processor 70A and a memory 72A. As explained in detail hereinbelow, processor 70A is configured to establish metrics 74 that indicate a connectivity status of host computer 22A, and store the metrics to memory 72A. In some embodiments, processor 70A may store metrics 74 to storage devices 50A.

Host computer 22B comprises a processor 64B, a memory 66B, and an adapter 68B. Adapter 68B is coupled to SAN 26B via a data connection 24B.

As described supra, module 36B is coupled to storage devices 50B via data connections 48B, and comprises adapters 32B and 42B, a cache 40B, and an interface 38B. Module 36B also comprises a processor 70B and a memory 72B.

Processors 64A, 64B, 70A and 70B typically comprise general-purpose computers, which are programmed in software to carry out the functions described herein. The software may be downloaded to host computers 22A and 22B and modules 36A and 36B in electronic form, over a network, for example, or it may be provided on non-transitory tangible media, such as optical, magnetic or electronic memory media. Alternatively, some or all of the functions of the processors may be carried out by dedicated or programmable digital hardware components, or using a combination of hardware and software elements.

Examples of adapters 32A, 32B, 42A, 42B, 68A and 68B, include switched fabric adapters such as Fibre Channel (FC) adapters, Internet Small Computer System Interface (iSCSI) adapters, Fibre Channel over Ethernet (FCoE) adapters and Infiniband™ adapters.

While the configuration shown in FIG. 2 shows storage host computers 22A and 22B coupled to storage controllers 34A and 34B via SANs 26A and 26B, other configurations are to be considered within the spirit and scope of the present invention. For example, host computers 22A and 22B can be coupled to a single storage controller 34 via a single SAN 26.

It is understood in advance that although this disclosure includes a detailed description on cloud computing, following, that implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes and storage systems (e.g. storage subsystem 20).

Figure 3:
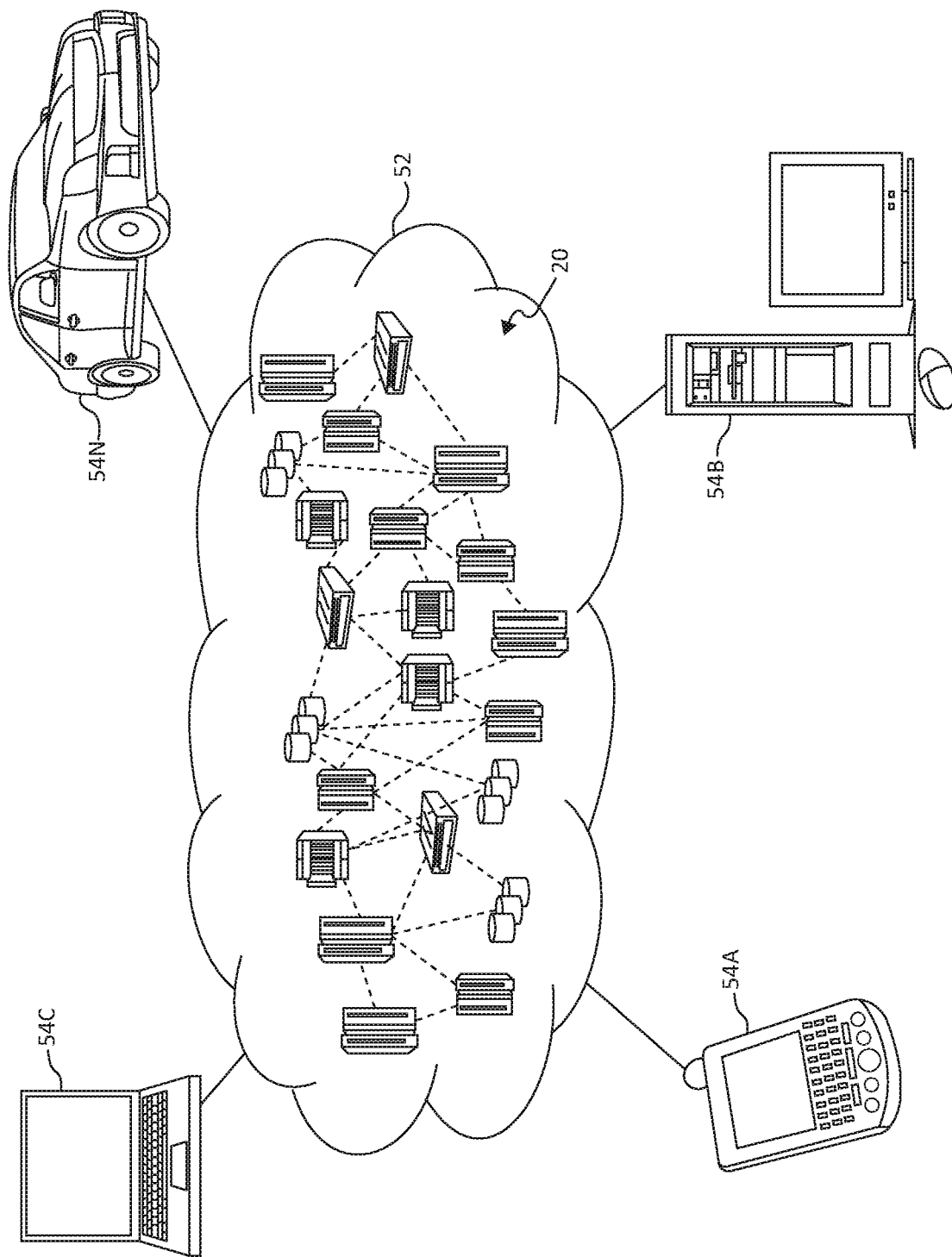
FIG. 3 illustrates a block diagram of an exemplary cloud computing environment according to embodiments of the present invention.

Referring now to FIG. 3, illustrative cloud computing environment 52 is depicted. As shown, cloud computing environment 52 comprises one or more storage subsystems 20 and cloud computing nodes with which local computing devices used by cloud consumers, such as, for example, personal digital assistant (PDA) or cellular telephone 54A, desktop computer 54B, laptop computer 54C, and/or automobile computer system 54N may communicate. Storage systems 20 and the cloud nodes may communicate with one another. They may be grouped (not shown) physically or virtually, in one or more networks, such as Private, Community, Public, or Hybrid clouds as described hereinabove, or a combination thereof. This allows cloud computing environment 52 to offer infrastructure, platforms and/or software as services for which a cloud consumer does not need to maintain resources on a local computing device. It is understood that the types of computing devices 54A-N shown in FIG. 3 are intended to be illustrative only and that storage subsystems 20, cloud computing nodes and cloud computing environment 52 can communicate with any type of computerized device over any type of network and/or network addressable connection (e.g., using a web browser).

Figure 4:
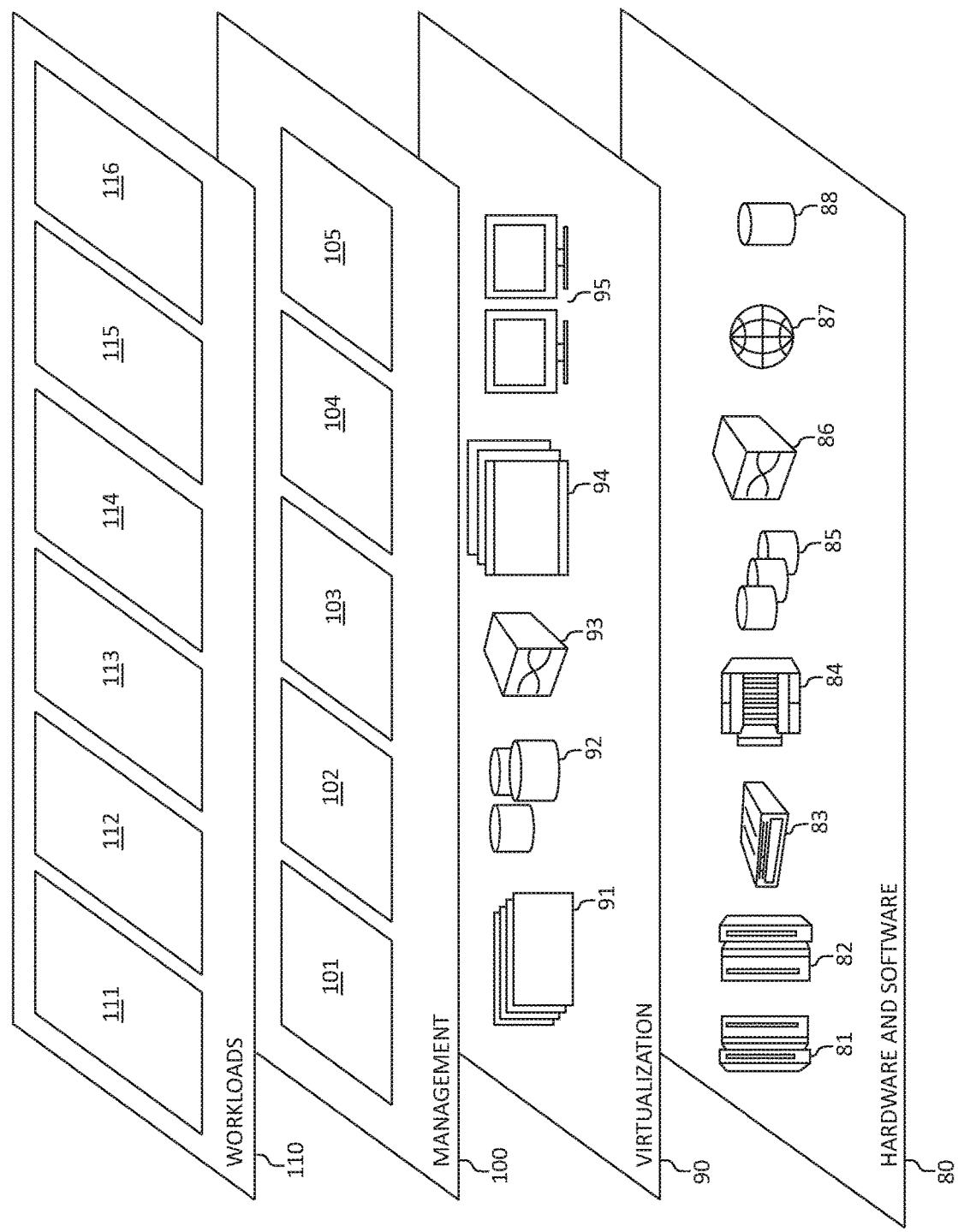
FIG. 4 illustrates a block diagram depicting abstraction model layers according to embodiments of the present invention.

Referring now to FIG. 4, a set of functional abstraction layers provided by cloud computing environment 52 (FIG. 3) is shown. It should be understood in advance that the components, layers, and functions shown in FIG. 4 are intended to be illustrative only and embodiments of the invention are not limited thereto. As depicted, the following layers and corresponding functions are provided:

Hardware and software layer 80 includes hardware and software components. Examples of hardware components include: mainframes 81; RISC (Reduced Instruction Set Computer) architecture based servers 82; servers 83; blade servers 84; storage devices 85; and networks and networking components 86. In some embodiments, software components include network application server software 87 and database software 88.

Virtualization layer 90 provides an abstraction layer from which the following examples of virtual entities may be provided: virtual servers 91; virtual storage 92; virtual networks 93, including virtual private networks; virtual applications and operating systems 94; and virtual clients 95.

In one example, management layer 100 may provide the functions described below. Resource provisioning 101 provides dynamic procurement of computing resources and other resources that are utilized to perform tasks within the cloud computing environment. Metering and Pricing 102 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 103 provides access to the cloud computing environment for consumers and system administrators. Service level management 104 provides cloud computing resource allocation and management such that required service levels are met. Service Level Agreement (SLA) planning and fulfillment 105 provides pre-arrangement for, and procurement of, cloud computing resources for which a future requirement is anticipated in accordance with an SLA.

Workloads layer 110 provides examples of functionality for which the cloud computing environment may be utilized. Examples of workloads and functions which may be provided from this layer include: mapping and navigation 111; software development and lifecycle management 112; virtual classroom education delivery 113; data analytics processing 114; transaction processing 115; and, in the context of the illustrated embodiments of the present invention, various data security workloads and functions 116, such as antivirus scanning workloads, or anti-malware scanning workloads. In addition, data security workloads and functions 116 may include such operations as data quarantining and/or data deleting functions. One of ordinary skill in the art will appreciate that the data security workloads and functions 116 may also work in conjunction with other portions of the various abstractions layers, such as those in hardware and software 80, virtualization 90, management 100, and other workloads 110 (such as data analytics processing 114, for example) to accomplish the various purposes of the illustrated embodiments of the present invention.

Continuing, FIG. 5 illustrates a method 500 for optimizing dual-layered data compression in a storage environment, in accordance with one embodiment of the present invention. The method 500 may be performed in accordance with the present invention in any of the environments depicted in FIGS. 1-4, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

The method 500 begins by, in a data storage system having a primary compressor and a secondary compressor, selectively using the primary compressor to perform a first one of a plurality of actions on Input/Output (I/O) data while performing a second one of the plurality of actions on the I/O data by the secondary compressor, thereby reducing latency and improving an overall compression performance while processing the I/O data (step 502).

As aforementioned, the present invention implements functionality as to use the most efficient properties of both the primary compressor, such as a compressor operating within a storage controller or storage system compute module, and a secondary compressor operating within a disk or flash drive enclosure, to achieve improved performance and lower latency of I/O throughput in the storage system. Additionally, the dual-layered compression techniques described herein may be implemented in a combination of application-level compression with a storage device which has built-in compression functionality. Here too, the application (e.g., a database) may have specialized knowledge on the data at hand or use domain specific compression and therefore can potentially achieve a better compression ratio and save bandwidth while in transfer to the storage device. The present invention may include a number of embodiments, however for the sake of brevity, three advantageous embodiments will be focused upon:

In one embodiment, metadata of I/O data is not compressed in the primary compressor. Rather, the secondary compressor is relied upon for compressing the metadata portion of the I/O data, while the primary compressor compresses the remaining portion. This embodiment is particularly relevant to architectures that swap metadata in and out of memory, and improves the performance thereof.

In another embodiment, the primary compressor is used to pad its data writes in order to achieve 4 KB alignment of data chunks. The secondary compressor is then used to compress the padding written by the primary compressor. This reduces the amount of 4 KB I/O transfers to the backend of the storage in a random read scenario, as will be further discussed.

In a further embodiment, data which is minimally compressible (i.e., below a predetermined compression ratio) is bypassed from being compressed by the primary compressor, since the compression it would receive is disproportionate to the energy expended to compress such. Instead, the secondary compressor is solely used to compress this data.

Reducing Metadata Latency

In storage systems that provide data reduction in the form of compression functionality, the amount of metadata associated with I/O data is typically significant enough to warrant a gain from compressing yet relatively limited compared to the amount of actual data. Some storage solutions hold all metadata in memory. This requires a large amount of memory and imposes a restriction on scalability. Other storage solutions choose to swap this metadata in and out of memory. Knowing that slow access to the metadata portion of the I/O data incurs a drastic impact on system performance, the functionality presented herein considers compressing the metadata portion using the secondary compressor, while compressing the remaining data portion using the primary compressor. This metadata compression by the secondary compressor improves performance since the compression is done at line speed. While the secondary compressor does not achieve a high compression ratio, the expense is justified as the metadata comprises only a small portion of all the data.

Accordingly, FIG. 6 illustrates a method 600 for optimizing dual-layered data compression in a storage environment, in accordance with one embodiment of the present invention. The method 600 may be performed in accordance with the present invention in any of the environments depicted in FIGS. 1-4, among others, in various embodiments. Of course, more or less operations than those specifically described in FIG. 6 may be included in method 600, as would be understood by one of skill in the art upon reading the present descriptions.

Each of the steps of the method 600 may be performed by any suitable component of the operating environment. For example, in various embodiments, the method 600 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

The method 600 begins by receiving I/O data including metadata of the I/O data (step 602). The metadata of the I/O data is refrained from being compressed by a primary compressor (e.g., the storage system controller or compute module) (step 604). Rather, the I/O metadata portion of the I/O data is compressed by the secondary compressor (e.g., operating in a disk or flash enclosure) (step 606), while the remaining I/O data is compressed by the primary compressor.

Improved Performance of Random 4 KB Reads

Figure 7A:
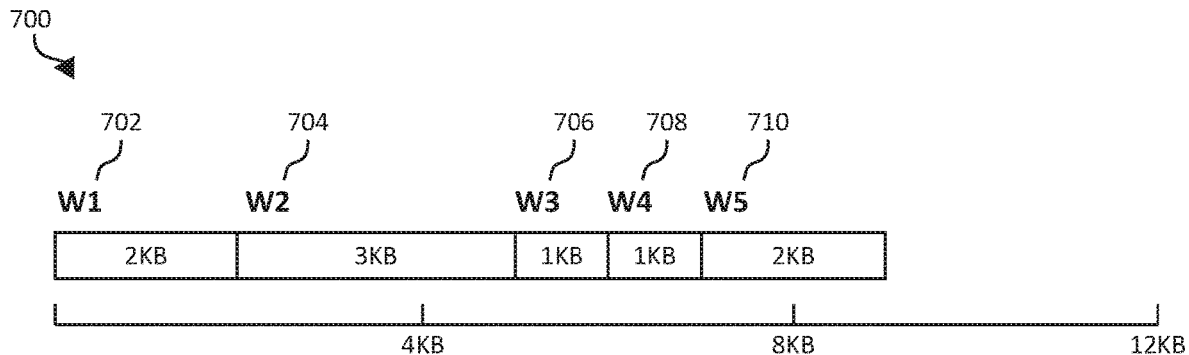
FIG. 7A illustrates a block diagram illustrating a series of write operations and boundaries thereof, in accordance with aspects of the present invention.

As aforementioned, flash drive systems typically use 4 KB alignment. When compression is being used, a 4 KB user write can translate into a compressed output block of any size between 0 KB-4 KB. The combined output of many writes will lead to having some writes crossing a 4 KB boundary as shown in the series of data write operations of block diagram 700 of FIG. 7A. Shown is a series of writes labeled write W1 702, write W2 704, write W3 706, write W4 708, and write W5 710. As illustrated, write W2 704 is split across two 4 KB chunks, as is write W5 710. Thus, when reading write W2 704 or write W5 710, two reads will be required totaling 8 KB of data to be read from the flash drive.

Figure 7B:
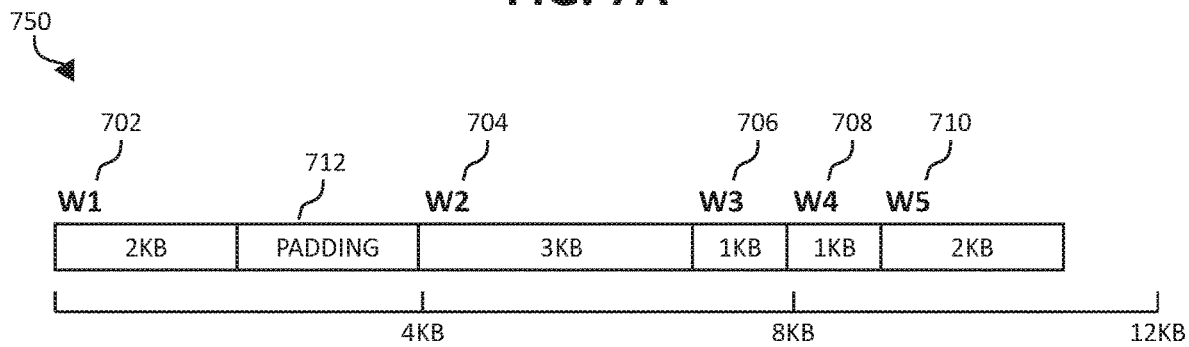
FIG. 7B illustrates an additional block diagram illustrating a series of write operations and boundaries thereof, in accordance with aspects of the present invention.

Hence, the mechanisms of the present invention align data write operations to 4 KB boundaries by the primary compressor, such that whenever a write operation will be split over two 4 KB chunks, the write operation is pushed to the next chunk and the gap created is filled with highly compressible padding (e.g., all zeros). The secondary compressor then compresses away the padding created by the primary compressor during the write operation. FIG. 7B illustrates the output of this logic in the series of data write operations of block diagram 750. As shown, since write W2 704 (which was previously split between two 4 KB boundaries in diagram 700) would have crossed the 4 KB boundary upon being written, write W2 704 is pushed by the primary compressor to the next 4 KB chunk and the gap created in doing so is filled by highly compressible padding 712. The secondary compressor then compresses away the highly compressible padding 712.

Figure 7C:
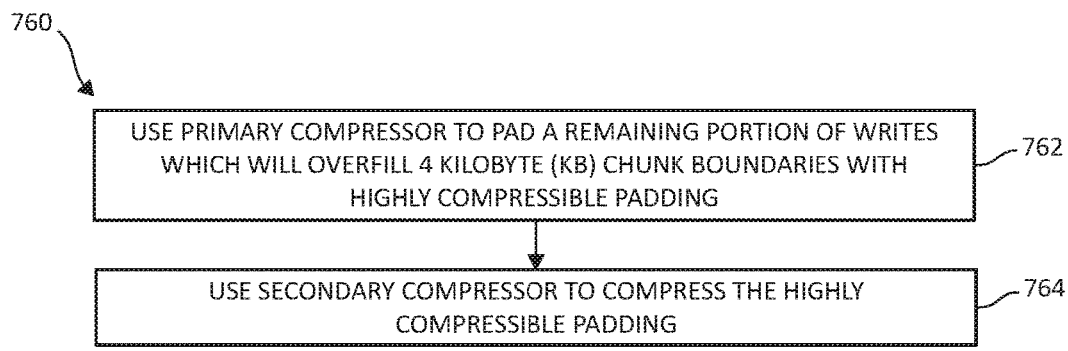
FIG. 7C illustrates an additional flowchart diagram illustrating an exemplary method for optimizing dual-layered data compression in a storage environment, by which aspects of the present invention may be implemented.

Reviewing, FIG. 7C illustrates a method 760 for optimizing dual-layered data compression in a storage environment, in accordance with one embodiment of the present invention. The method 760 may be performed in accordance with the present invention in any of the environments depicted in FIGS. 1-4, among others, in various embodiments. Of course, more or less operations than those specifically described in FIG. 7 may be included in method 760, as would be understood by one of skill in the art upon reading the present descriptions.

Each of the steps of the method 760 may be performed by any suitable component of the operating environment. For example, in various embodiments, the method 760 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 760. Illustrative processors include, but are not limited to, a central processing unit (CPU), an application specific integrated circuit (ASIC), a field programmable gate array (FPGA), etc., combinations thereof, or any other suitable computing device known in the art.

The method 700 begins by using the primary compressor to pad a remaining portion of writes which will overfill a 4 KB chunk boundary with highly compressible padding (e.g., all zeros) (step 762). The secondary compressor is then used to compress away the highly compressible padding (step 764).

Reducing Latency of Minimally Compressible Data

Some data inherently does not compress well, and using the primary compressor will not provide a significant gain neither in compression ratio nor in bandwidth savings. However, even a small savings in capacity or bandwidth from some compression can be advantageous provided the expense to do so does not outweigh the result. Therefore, in one embodiment, the functionality of the present invention bypasses the primary compressor for such minimally compressible data (e.g., data having lower than a predetermined compression ratio) and rather relies on the secondary compressor to compress this data. Bypassing the primary compressor will lower latency on read, and possibly also on write, depending on how the compression estimation is performed. Since the secondary (built-in) compression is performed in any case, it adds no latency when compared to regular I/O data, and considering the data is not very compressible, the weaker compression mechanisms of the secondary compressor will not amount to high loss of compression ratio. Additionally, knowing there is a secondary compression layer allows the compressibility detection algorithm to be relaxed since the secondary compressor serves as a safety net for slower adaptation of the algorithm.

One implementation of this functionality may be performed as follows. By default, I/O data is compressed by the primary compressor. Periodically, the results of compression (e.g., a compression ratio) may be observed for each region of virtual storage space (the size of a region can be tuned to the specific scenario). If the results of a certain region exhibit low compression savings, then compression is disabled at the primary compressor thereby compressing the I/O data only at the secondary compressor. Similarly, if the secondary compressor reports high compression savings for a region during a periodic observation, then the primary compressor may be re-enabled (meaning that the compressibility of the data for this region has changed).

Figure 8:
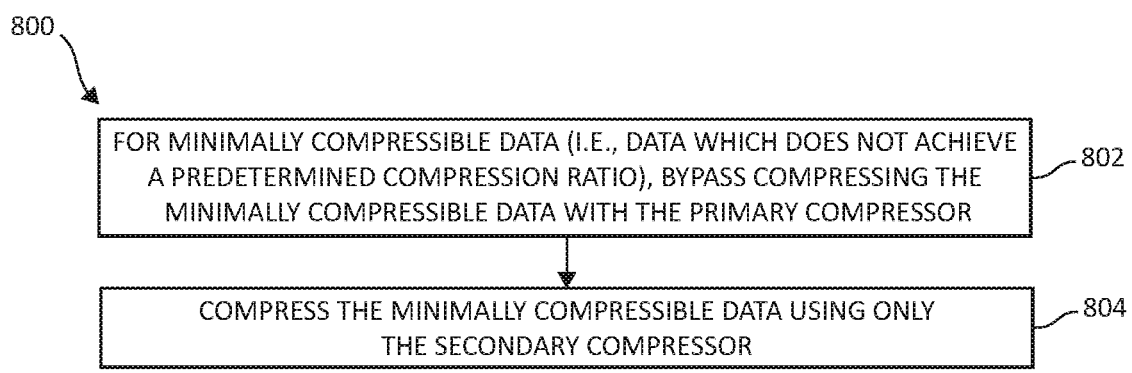
FIG. 8 illustrates still an additional flowchart diagram illustrating an exemplary method for optimizing dual-layered data compression in a storage environment, by which aspects of the present invention may be implemented.

Concluding in review, FIG. 8 illustrates a method 800 for optimizing dual-layered data compression in a storage environment, in accordance with one embodiment of the present invention. The method 800 may be performed in accordance with the present invention in any of the environments depicted in FIGS. 1-4, among others, in various embodiments. Of course, more or less operations than those specifically described in FIG. 8 may be included in method 800, as would be understood by one of skill in the art upon reading the present descriptions.

Each of the steps of the method 800 may be performed by any suitable component of the operating environment. For example, in various embodiments, the method 800 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 800. Illustrative processors include, but are not limited to, a central processing unit (CPU), an application specific integrated circuit (ASIC), a field programmable gate array (FPGA), etc., combinations thereof, or any other suitable computing device known in the art.

The method 800 begins by, for minimally compressible data (i.e., data which does not achieve a predetermined compression ratio upon observation of a given storage region), bypassing the compression of the minimally compressible data using the primary compressor (step 802). Instead, the minimally compressible data is then compressed using only the secondary compressor (step 804). Here again, the primary compressor may be re-enabled should the secondary compressor report high compression savings (e.g., a predetermined compression ratio) for a region during a periodic observation.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The invention claimed is:

1. A method for optimizing dual-layered data compression in a storage environment, by a processor device, comprising:
   in a data storage system having a primary compressor and a secondary compressor, selectively using the primary compressor to perform a first one of a plurality of actions on Input/Output (I/O) data while simultaneously performing a second one of the plurality of actions on the I/O data by the secondary compressor, thereby reducing latency and improving an overall compression performance while processing the I/O data; wherein the primary compressor is implemented within a storage controller receiving the I/O data from a host and directing the I/O data from the host to one of a plurality of storage pools in the data storage system, and the secondary compressor is implemented within a drive-enclosure of one of a flash drive and a disk drive having built-in compression capabilities of the data storage system and providing at least one of the plurality of storage pools receiving the I/O data from the host, the primary and secondary compressors each used as in-line compressors for performing the first one and the second one of the plurality of actions on the I/O data as the I/O data is received from the host.

2. The method of claim 1, wherein the first one of the plurality of actions comprises refraining from compressing metadata of the I/O data by the primary compressor and the second one of the plurality of actions comprises compressing the metadata of the I/O data by the secondary compressor.

3. The method of claim 1, wherein the first one of the plurality of actions comprises padding writes of the I/O data compressed by the primary compressor to achieve a predetermined size alignment and the second one of the plurality of actions comprises compressing the padding by the secondary compressor.

4. The method of claim 1, wherein the first one of the plurality of actions comprises, if the I/O data is not compressible beyond a predetermined compression ratio, bypassing compression of the I/O data by the primary compressor and the second one of the plurality of actions comprises compressing the I/O data by the secondary compressor.

5. The method of claim 4, further including using the primary compressor to compress the I/O data by default; and
periodically determining a resulting compression ratio of the I/O data by the primary compressor, wherein if the I/O data is not being compressed beyond the predetermined compression ratio, disabling the primary compressor.

6. The method of claim 5, further including, once the primary compressor has been disabled, periodically determining the resulting compression ratio of the I/O data by the secondary compressor, wherein if the I/O data is being compressed beyond the predetermined compression ratio, re-enabling the primary compressor.

7. The method of claim 1, wherein the primary compressor is a storage system controller-level compressor and the secondary compressor is a storage device-level or application-level compressor.

8. A system for optimizing dual-layered data compression in a storage environment, the system comprising:
a processor device executing instructions stored in a memory, wherein the processor device:
in a data storage system having a primary compressor and a secondary compressor, selectively uses the primary compressor to perform a first one of a plurality of actions on Input/Output (I/O) data while simultaneously performing a second one of the plurality of actions on the I/O data by the secondary compressor, thereby reducing latency and improving an overall compression performance while processing the I/O data; wherein the primary compressor is implemented within a storage controller receiving the I/O data from a host and directing the I/O data from the host to one of a plurality of storage pools in the data storage system, and the secondary compressor is implemented within a drive-enclosure of one of a flash drive and a disk drive having built-in compression capabilities of the data storage system and providing at least one of the plurality of storage pools receiving the I/O data from the host, the primary and secondary compressors each used as in-line compressors for performing the first one and the second one of the plurality of actions on the I/O data as the I/O data is received from the host.

9. The system of claim 8, wherein the first one of the plurality of actions comprises refraining from compressing metadata of the I/O data by the primary compressor and the second one of the plurality of actions comprises compressing the metadata of the I/O data by the secondary compressor.

10. The system of claim 8, wherein the first one of the plurality of actions comprises padding writes of the I/O data compressed by the primary compressor to achieve a predetermined size alignment and the second one of the plurality of actions comprises compressing the padding by the secondary compressor.

11. The system of claim 8, wherein the first one of the plurality of actions comprises, if the I/O data is not compressible beyond a predetermined compression ratio, bypassing compression of the I/O data by the primary compressor and the second one of the plurality of actions comprises compressing the I/O data by the secondary compressor.

12. The system of claim 11, wherein the processor device uses the primary compressor to compress the I/O data by default; and
periodically determines a resulting compression ratio of the I/O data by the primary compressor, wherein if the I/O data is not being compressed beyond the predetermined compression ratio, disabling the primary compressor.

13. The system of claim 12, wherein the processor device, once the primary compressor has been disabled, periodically determines the resulting compression ratio of the I/O data by the secondary compressor, wherein if the I/O data is being compressed beyond the predetermined compression ratio, re-enables the primary compressor.

14. The system of claim 8, wherein the primary compressor is a storage system controller-level compressor and the secondary compressor is a storage device-level or application-level compressor.

15. A computer program product for optimizing dual-layered data compression in a storage environment, by a processor device, the computer program product embodied on a non-transitory computer-readable storage medium having computer-readable program code portions stored therein, the computer-readable program code portions comprising:
an executable portion that, in a data storage system having a primary compressor and a secondary compressor, selectively uses the primary compressor to perform a first one of a plurality of actions on Input/Output (I/O) data while simultaneously performing a second one of the plurality of actions on the I/O data by the secondary compressor, thereby reducing latency and improving an overall compression performance while processing the I/O data; wherein the primary compressor is implemented within a storage controller receiving the I/O data from a host and directing the I/O data from the host to one of a plurality of storage pools in the data storage system, and the secondary compressor is implemented within a drive-enclosure of one of a flash drive and a disk drive having built-in compression capabilities of the data storage system and providing at least one of the plurality of storage pools receiving the I/O data from the host, the primary and secondary compressors each used as in-line compressors for performing the first one and the second one of the plurality of actions on the I/O data as the I/O data is received from the host.

16. The computer program product of claim 15, wherein the first one of the plurality of actions comprises refraining from compressing metadata of the I/O data by the primary compressor and the second one of the plurality of actions comprises compressing the metadata of the I/O data by the secondary compressor.

17. The computer program product of claim 15, wherein the first one of the plurality of actions comprises padding writes of the I/O data compressed by the primary compressor to achieve a predetermined size alignment and the second one of the plurality of actions comprises compressing the padding by the secondary compressor.

18. The computer program product of claim 15, wherein the first one of the plurality of actions comprises, if the I/O data is not compressible beyond a predetermined compression ratio, bypassing compression of the I/O data by the primary compressor and the second one of the plurality of actions comprises compressing the I/O data by the secondary compressor.

19. The computer program product of claim 18, further including an executable portion that uses the primary compressor to compress the I/O data by default; and an executable portion that periodically determines a resulting compression ratio of the I/O data by the primary compressor, wherein if the I/O data is not being compressed beyond the predetermined compression ratio, disabling the primary compressor.

20. The computer program product of claim 19, further including an executable portion that, once the primary compressor has been disabled, periodically determines the resulting compression ratio of the I/O data by the secondary compressor, wherein if the I/O data is being compressed beyond the predetermined compression ratio, re-enables the primary compressor.

21. The computer program product of claim 15, wherein the primary compressor is a storage system controller-level compressor and the secondary compressor is a storage device-level or application-level compressor.

\* \* \* \* \*